United States Patent
Bennett

(10) Patent No.: US 9,799,845 B2
(45) Date of Patent: Oct. 24, 2017

(54) METHOD AND DEVICE FOR COUPLING MULTIPLE GROUND PLANES

(71) Applicant: Intel Corporation, Santa Clara, CA (US)

(72) Inventor: Douglas G. Bennett, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 14/752,876

(22) Filed: Jun. 27, 2015

(65) Prior Publication Data

US 2016/0380225 A1    Dec. 29, 2016

(51) Int. Cl.
| | |
|---|---|
| *H01L 35/24* | (2006.01) |
| *H01L 51/52* | (2006.01) |
| *H01L 51/56* | (2006.01) |
| *H05K 1/02* | (2006.01) |
| *H05K 3/32* | (2006.01) |
| *H01R 4/48* | (2006.01) |
| *H01R 12/57* | (2011.01) |

(52) U.S. Cl.
CPC .............. *H01L 51/52* (2013.01); *H01L 51/56* (2013.01); *H01R 4/48* (2013.01); *H01R 12/57* (2013.01); *H05K 1/0215* (2013.01); *H05K 3/325* (2013.01); *H05K 2201/0311* (2013.01)

(58) Field of Classification Search
CPC ................................. H01L 51/52; H01L 51/56
USPC .......................................................... 257/40
See application file for complete search history.

(56) References Cited

U.S. PATENT DOCUMENTS

| | | | | |
|---|---|---|---|---|
| 5,357,402 A | * | 10/1994 | Anhalt | ................ G06K 7/0047 174/51 |
| 5,537,294 A | | 7/1996 | Siwinski | |
| 6,330,991 B1 | * | 12/2001 | Boe | ........................ G06F 1/184 248/200 |
| 6,456,504 B1 | | 9/2002 | Loforte et al. | |
| 6,851,986 B2 | * | 2/2005 | Zhao | .................. H01R 13/2435 439/595 |
| 7,510,400 B2 | * | 3/2009 | Glovatsky | .............. F21S 48/115 362/800 |

(Continued)

OTHER PUBLICATIONS

International Search Report and Written Opinion issued in PCT Application No. PCT/US2016/034851, dated Sep. 13, 2016, 11 pages.

*Primary Examiner* — Xinning Niu
*Assistant Examiner* — Vu A Vu
(74) *Attorney, Agent, or Firm* — Grossman, Tucker, Perreault & Pfleger, PLLC

(57) ABSTRACT

Generally, this disclosure provides systems, devices and methods for improved electrical coupling of multiple ground planes of a device. The device may include a plurality of ground planes and an electrically conductive ground clip. The ground clip may include a base portion configured to secure the ground clip to the device and a plurality of spring fingers. Each of the spring fingers may be configured to contact and electrically couple to one of the plurality of ground planes, wherein the ground clip is to provide a conduction path between each of the spring fingers. One of the spring fingers may pass through an opening or cut-through in a first ground plane to contact a second ground plane. The device may be a mobile communication or computing platform.

25 Claims, 6 Drawing Sheets

(56) References Cited

U.S. PATENT DOCUMENTS

| | | | |
|---|---|---|---|
| 8,100,719 B2* | 1/2012 | Ouyang | H04M 1/0277 439/607.33 |
| 2005/0231186 A1* | 10/2005 | Saavedra Barrera | A61N 1/18 324/71.1 |
| 2010/0073843 A1 | 3/2010 | Yu et al. | |
| 2011/0069049 A1* | 3/2011 | Wong | G09G 3/3216 345/205 |
| 2011/0149460 A1 | 6/2011 | Weng et al. | |
| 2011/0273876 A1* | 11/2011 | Stolyar | F21V 17/101 362/235 |
| 2011/0299215 A1 | 12/2011 | Chu | |

\* cited by examiner

500

```
┌─────────────────────────────────────────────┐
│ Bond a ground clip to the device, wherein   │
│ the ground clip is electrically conductive  │
│ and comprises a plurality of spring         │
│ fingers                                     │
│                                             │
│                    510                      │
└─────────────────────────────────────────────┘
                      │
                      ▼
┌─────────────────────────────────────────────┐
│ Configure a first of the spring fingers to  │
│ contact a first of the ground planes        │
│                                             │
│                    520                      │
└─────────────────────────────────────────────┘
                      │
                      ▼
┌─────────────────────────────────────────────┐
│ Configure a second of the spring fingers to │
│ contact a second of the ground planes       │
│                                             │
│                    530                      │
└─────────────────────────────────────────────┘
                      │
                      ▼
┌─────────────────────────────────────────────┐
│ Create an opening in the second ground plane│
│                                             │
│                    540                      │
└─────────────────────────────────────────────┘
                      │
                      ▼
┌─────────────────────────────────────────────┐
│ Configure a third of the spring fingers to  │
│ contact a third of the ground planes through│
│ the opening in the second ground plane      │
│                                             │
│                    550                      │
└─────────────────────────────────────────────┘
```

FIG. 5

METHOD AND DEVICE FOR COUPLING MULTIPLE GROUND PLANES

FIELD

The present disclosure relates to ground planes, and more particularly, to electrical coupling of multiple ground planes in a device.

BACKGROUND

Electronic devices, including mobile platforms such as, for example, tablets and smart phones, are being designed and manufactured with reduced profiles or widths. The resulting volume limitations may provide less space for electrical connections between ground planes and make such connections more difficult to fabricate and less reliable. Existing solutions may use conductive fabrics, foams and/or adhesives. These techniques generally require time to set or cure and may lose their effectiveness over time with respect to both contact and electrical conduction properties. Additionally, fabrics and adhesives are typically restricted to a given thickness which may raise manufacturing tolerance issues.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

FIG. 5 illustrates a flowchart of operations of another example embodiment consistent with the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure provides systems, devices and methods for improved electrical coupling of multiple ground planes of a device. In some embodiments, the device may include a plurality of ground planes and an electrically conductive ground clip configured to contact each of the ground planes to prevent these metal planes from floating and functioning as antennas which can generate electromagnetic noise. The ground clip may include a base portion configured to secure the ground clip to some element or structure of the device. The ground clip may also include a plurality of spring fingers. Each of the spring fingers may be configured to contact and electrically couple to one of the ground planes such that the ground clip provides a conduction path between each of the spring fingers. One of the spring fingers may pass through an opening or cut-through in a first ground plane to contact a second ground plane. The device may be a mobile communication or computing platform configured with a relatively thin profile which may not suitably accommodate other forms of ground plane coupling.

Figure 1:
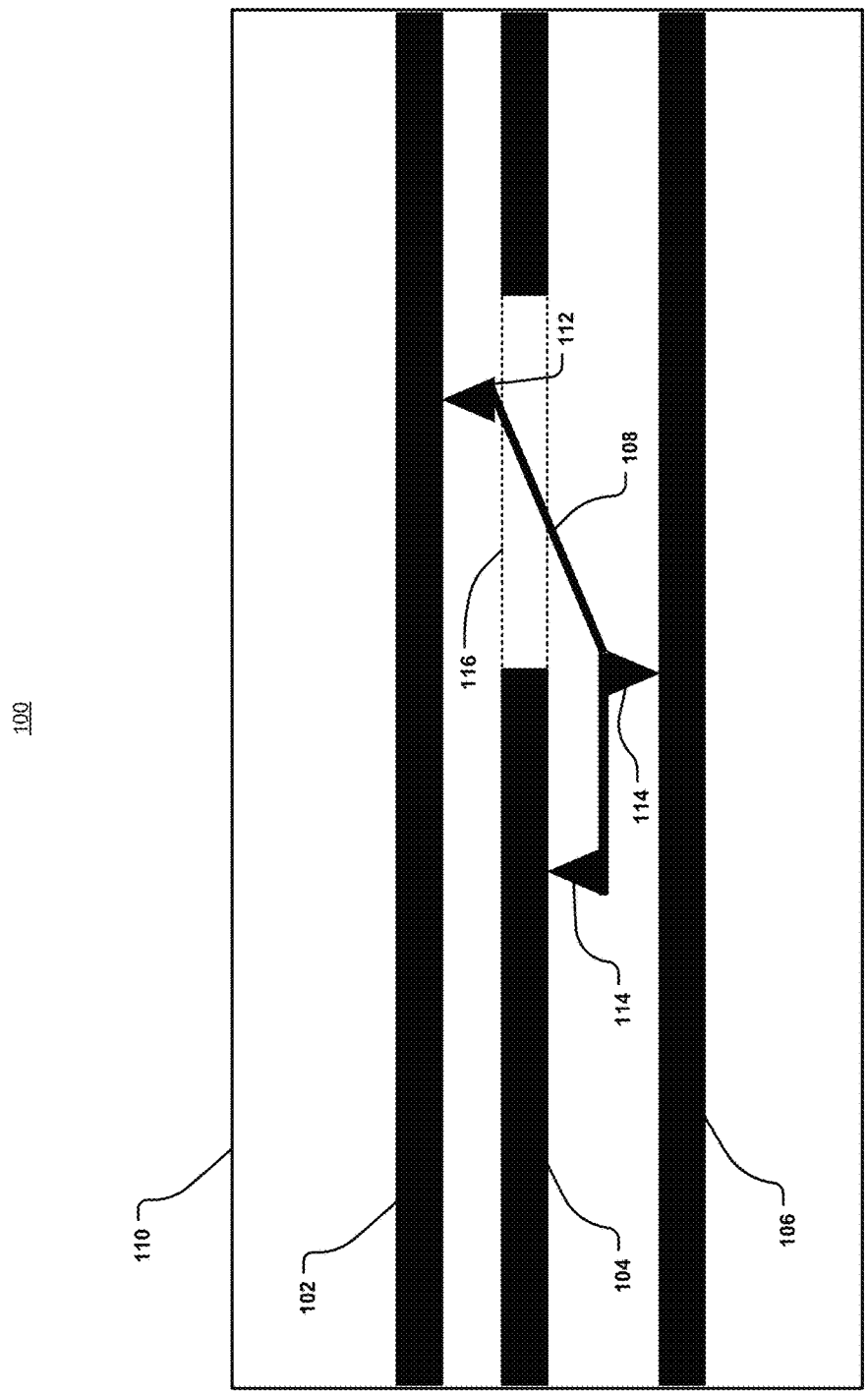
FIG. 1 illustrates a side view schematic diagram of an example embodiment consistent with the present disclosure.

FIG. 1 illustrates a side view schematic diagram 100 of an example embodiment consistent with the present disclosure. A device 110 is shown to include a number of ground planes 102, 104, 106 stacked in a parallel fashion relative to each other. The device may be a mobile communication or computing platform, such as, for example, a smart phone or tablet. Such devices may generally have a relatively thin profile or width. One of the ground planes may be associated with the base (or shell or casing) of the device. Another of the ground planes may be associated with a stiffening or damping mid-frame component configured to provide rigidity to the device, particularly in light of the thin profile. Yet another of the ground planes may be associated with a display element of the device, for example to reduce electrostatic discharge (ESD) effects.

An electrically conductive mechanism 108 is provided to couple the multiple ground planes 102, 104, 106 to a common ground potential, for example through contact points 112, 114. Ground plane 104 may be configured with an opening, cut-through or gap 116 through which contact point 112 may connect to ground plane 102.

In some embodiments, ground plane 106 may be associated with a base of the device and may serve as a primary ground plane. Ground plane 104 may be associated with a mid-frame support structure or stiffening member and ground plane 102 may be associated with a display element of the device. Although only three ground planes are illustrated in this figure and the discussion below, it will be appreciated that the concept can be extended to any number of ground planes that may be required.

Figure 2:
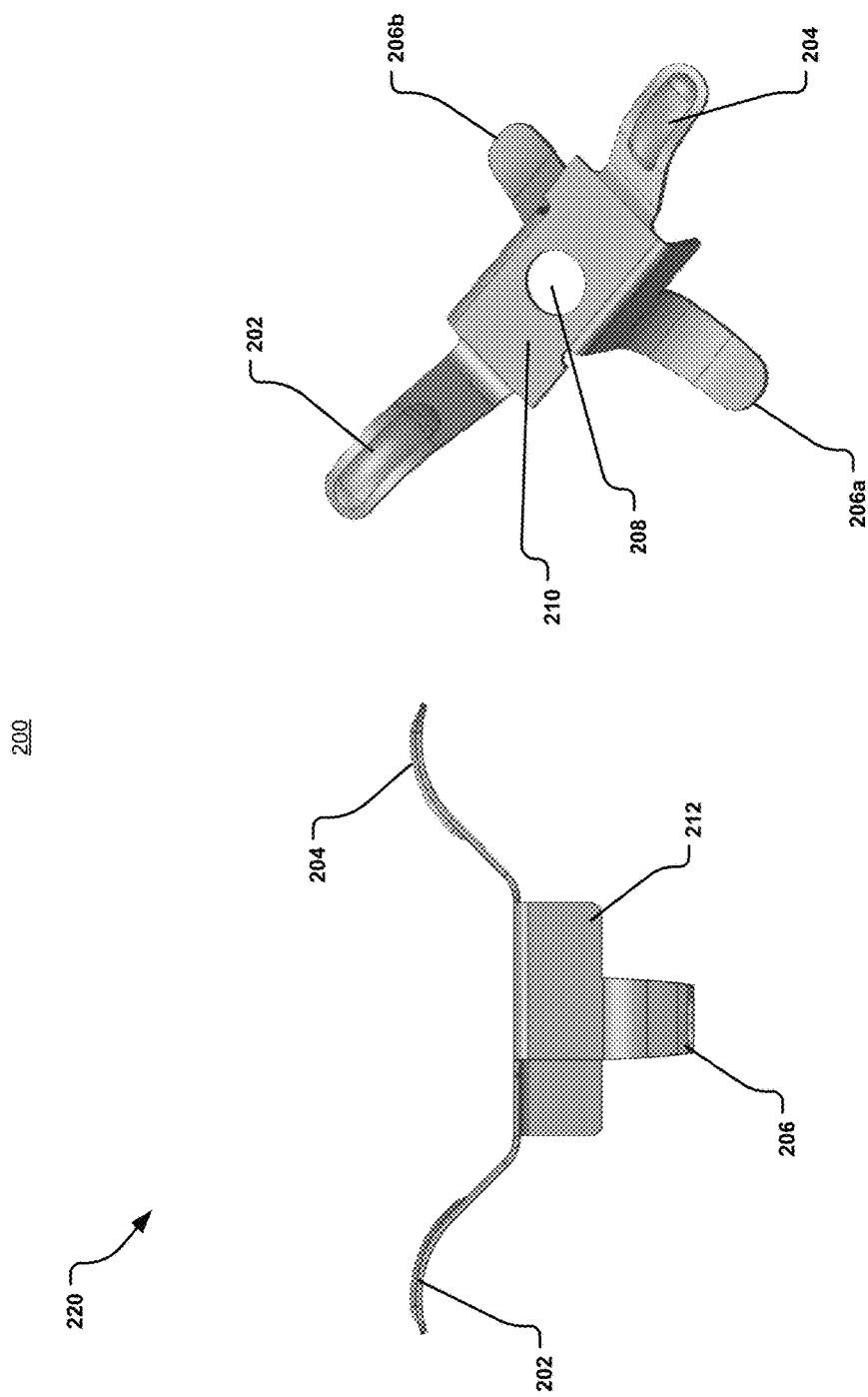
FIG. 2 illustrates a perspective view of a ground clip consistent with one example embodiment of the present disclosure.

FIG. 2 illustrates a perspective view 200 of a ground clip 220 consistent with one example embodiment of the present disclosure. In some embodiments, the electrically conductive mechanism 108 may be configured as a ground clip 220 that includes a base portion 210, side walls 212 and a number of spring fingers 202, 204, 206 that may serve as electrical contact points to the ground planes 102, 104, 106, as will be explained in greater detail below. The base portion 210 may have a cut-out (or hole) 208 through its surface. For example, the hole 208 may be drilled through or stamped out of the surface. The base 210, side walls 212 and/or the hole 208 may be configured to facilitate attachment or mounting of the ground clip to a structure within the device 110 as will be explained below.

In some embodiments, the ground clip 220 may be fabricated from electrically conductive materials such as, for example, copper (Cu), beryllium copper (BeCu) or gold (Au), although any conductive material may be used. In some embodiments, the ground clip may be gold plated.

Figure 3:
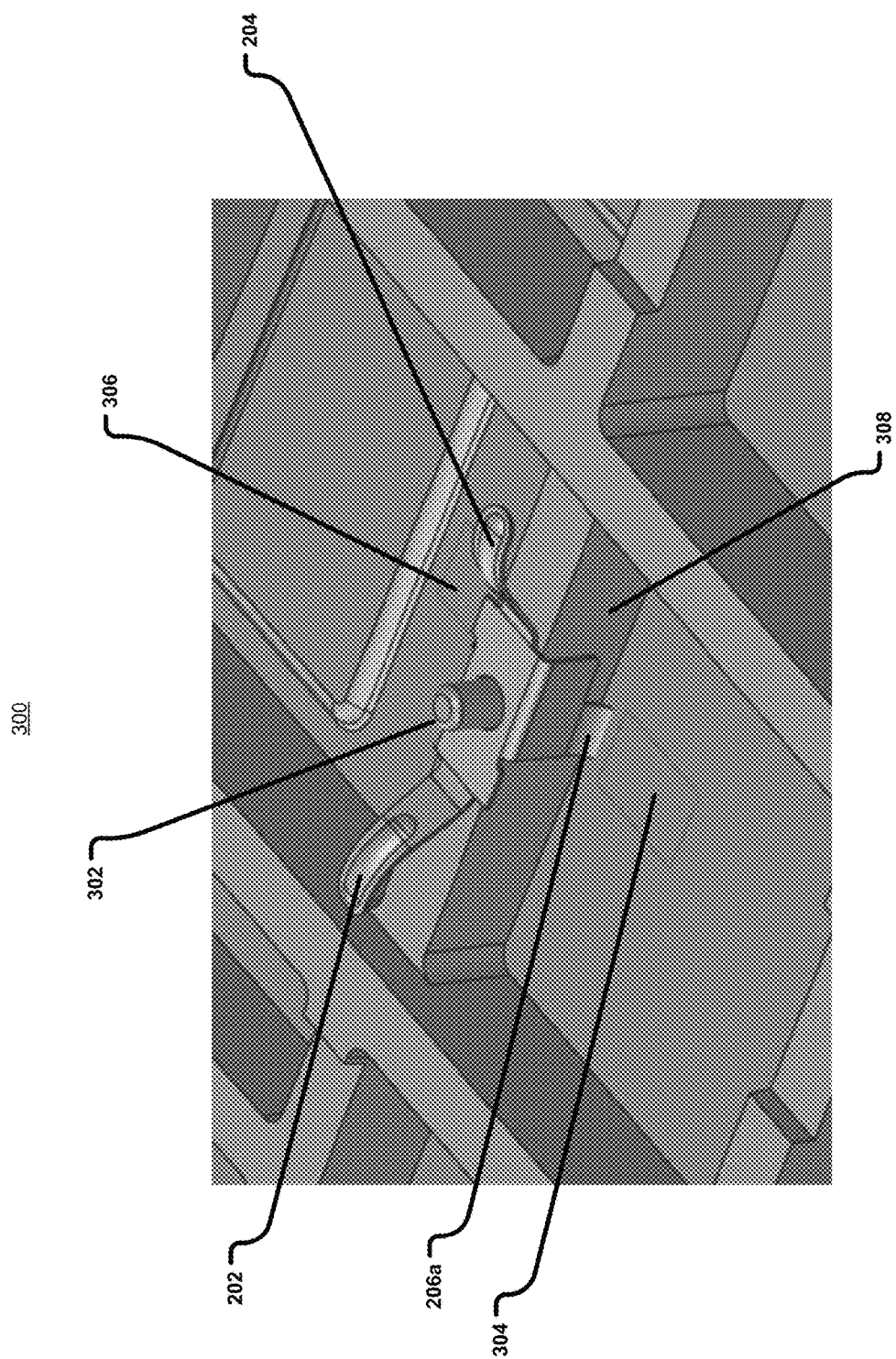
FIG. 3 illustrates a perspective view of a ground clip deployment consistent with one example embodiment of the present disclosure.

FIG. 3 illustrates a perspective view 300 of a ground clip deployment consistent with one example embodiment of the present disclosure. The ground clip 220 is shown attached to a structural member or frame component 308 of the device. In some embodiments, the attachment may be accomplished by press fitting the clip 220 to the structural member 308 so that, for example, friction between the side walls 212 and the structural member 308 holds the clip in place. In some embodiments, a thermoplastic staking (or heat staking) process may be employed to attach the clip 220 to the structural member 308 using a plastic stud 302 through the ground clip hole 208. In some embodiments, a mechanical fastener, such as a screw or other suitable fastener, may be employed to secure the clip 220.

Also, in this figure, spring finger 206a is shown to be electrically coupled to a contact patch 304 on a ground plane of, for example, the base of the device. Although hidden in this perspective view, spring finger 206b is also electrically coupled to a contact patch 306 on the ground plane. Spring fingers 202 and 204 are shown as freely extending upward, in an uncompressed mode, prior to placement of additional layers of the device on top of the clips.

Figure 4:
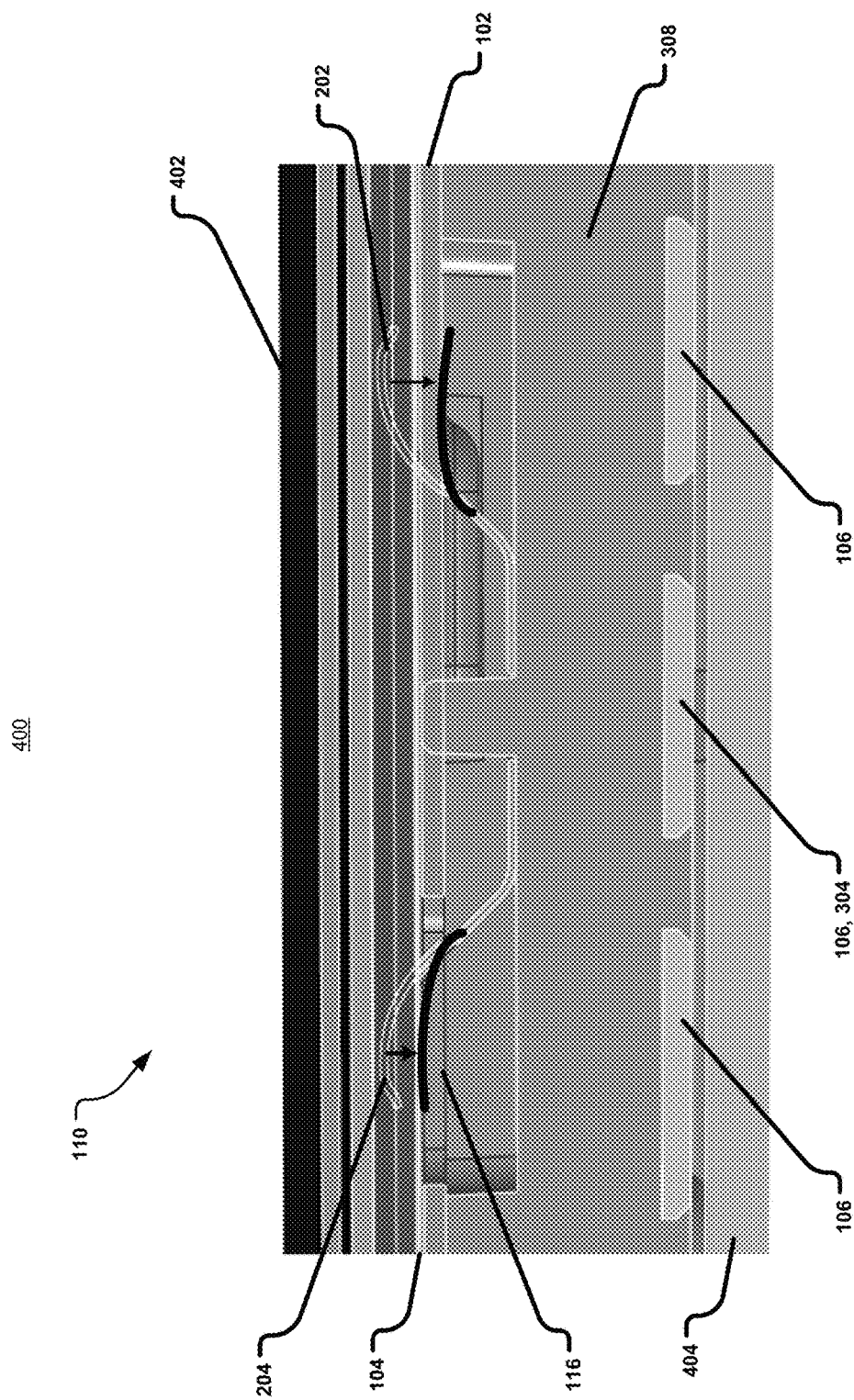
FIG. 4 illustrates a cross sectional side view of an example embodiment consistent with the present disclosure.

FIG. 4 illustrates a cross sectional side view 400 of an example embodiment consistent with the present disclosure. The device 110 and ground clip 220 are shown in cross section. Portions of ground plane 106 are shown at the base of the device segmented into pieces, in this particular cross-sectional slice, by structural member 308. The center piece of ground plane 106 may correspond to the contact patch 304, to which spring finger 206a (not shown in this view) is coupled.

Spring finger 202 is shown, on the right side of the figure, in both an uncompressed and compressed position with a downward arrow indicating direction of compression. When in the compressed state, spring finger 202 makes contact with ground plane 102.

Spring finger 204 is shown, on the left side of the figure, in both an uncompressed and compressed position with a downward arrow indicating direction of compression. When in the compressed state, spring finger 204 makes contact with ground plane 104 through the opening 116 in ground plane layer 102.

The spring fingers may be configured to provide a level of compression force required for suitable grounding contact and to allow adaption to manufacturing tolerance variations in the relative positions of the ground planes and other layers. This level of compression force may depend on physical dimensions of the spring fingers and the spacing between layers.

The cross sectional view also illustrates that the device may include many additional layers, such as, for example, a plastic skin 404 and the display element 402. The operation of the display element 402 may be improved through the presence of associated ground plane 104 which may reduce ESD effects.

FIG. 5 illustrates a flowchart of operations 500 of another example embodiment consistent with the present disclosure. The operations provide a method for improved electrical coupling of multiple ground planes of a device. At operation 510, a ground clip is bonded to the device, wherein the ground clip is electrically conductive and comprises a plurality of spring fingers. At operation 520, a first of the spring fingers is configured to contact a first of the ground planes. At operation 530, a second of the spring fingers is configured to contact a second of the ground planes. At operation 540, an opening is created in the second ground plane. At operation 550, a third of the spring fingers is configured to contact a third of the ground planes through the opening in the second ground plane.

Figure 6:
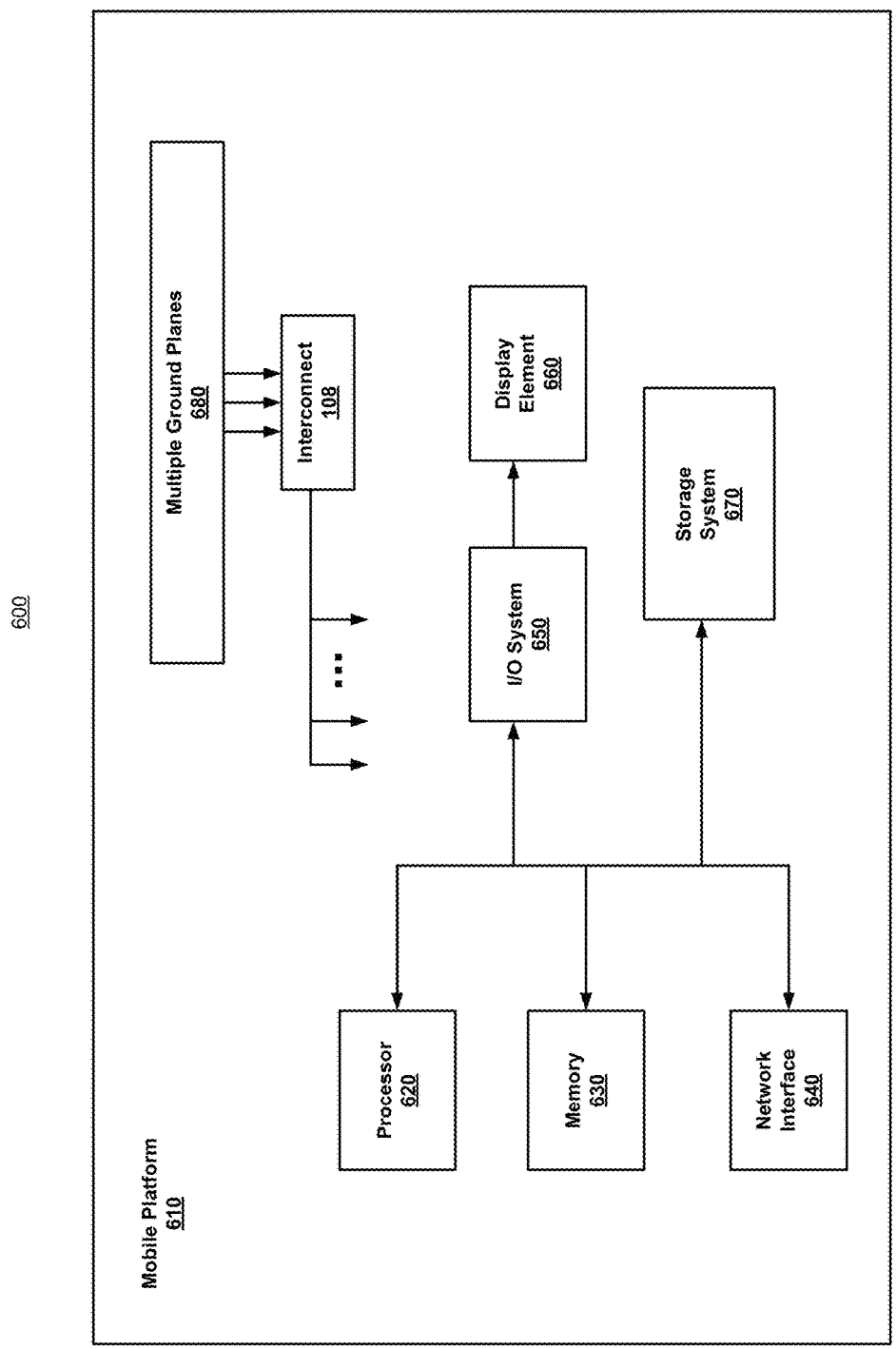
FIG. 6 illustrates a system diagram of another example embodiment consistent with the present disclosure.

FIG. 6 illustrates a system diagram 600 of another example embodiment consistent with the present disclosure. The system 600 may be a mobile communication or computing platform or device 610 such as, for example, a smart phone, smart tablet, personal digital assistant (PDA), mobile Internet device (MID), convertible tablet, notebook or laptop computer, or any other suitable device. It will be appreciated, however, that embodiments of the system described herein are not limited to mobile platforms, and in some embodiments, the system 600 may be a workstation, desktop computer or other electronic device. The device may generally present various interfaces to a user via a display element 660 such as, for example, a touch screen, liquid crystal display (LCD), organic light emitting diode (OLED) display or any other suitable display type.

The system 600 is shown to include any number of processors 620 and memory 630. In some embodiments, the processors 620 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. The memory 630 may be coupled to the processors. The memory 630 may be any of a wide variety of memories (including various layers of memory hierarchy and/or memory caches) as are known or otherwise available to those of skill in the art. It will be appreciated that the processors and memory may be configured to store, host and/or execute one or more user applications or other software modules. These applications may include, but not be limited to, for example, any type of computation, communication, data management, data storage and/or user interface task. In some embodiments, these applications may employ or interact with any other components of the mobile platform 610.

System 600 is also shown to include network interface module 640 which may include wireless communication capabilities, such as, for example, cellular communications, Wireless Fidelity (WiFi), Bluetooth®, and/or Near Field Communication (NFC). The wireless communications may conform to or otherwise be compatible with any existing or yet to be developed communication standards including past, current and future version of Bluetooth®, Wi-Fi and mobile phone communication standards.

System 600 is also shown to include an input/output (IO) system or controller 650 which may be configured to enable or manage data communication between processor 620 and other elements of system 600, for example display element 660, or other elements (not shown) external to system 600.

System 600 is also shown to include multiple ground planes 680 and an interconnect mechanism 108 to couple the ground planes to each other and/or other system components, as described previously.

It will be appreciated that in some embodiments, the various components of the system 600 may be combined in a system-on-a-chip (SoC) architecture. In some embodiments, the components may be hardware components, firmware components, software components or any suitable combination of hardware, firmware or software.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as, for example, processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry," as used in any embodiment herein, may include, for example, singly or in any combination, hardwired circuitry, programmable circuitry, state machine circuitry, and/or firmware that stores instructions executed by programmable circuitry. An application (or "App") may be embodied as code or instructions which may be executed on programmable circuitry such as a host processor or other programmable circuitry. A module, as used in any embodiment herein, may be embodied as circuitry. The circuitry may be embodied as an integrated circuit, such as an integrated circuit chip. In some embodiments, a module may thus be implemented in software and/or firmware and may comprise one or more processes, threads or subroutines of a single process. Additionally, in some embodiments, a module may be distributed and executed on separate devices.

Thus, the present disclosure provides systems, devices, and methods for improved electrical coupling of multiple ground planes of a device. The following examples pertain to further embodiments.

According to Example 1 there is provided a ground clip for coupling a plurality of ground planes of a device. The ground clip may include a base portion to secure the ground clip to the device; and a plurality of spring fingers, each of the spring fingers to contact and electrically couple to one of the ground planes, and the ground clip is electrically conductive to provide a conduction path between each of the spring fingers.

Example 2 may include the subject matter of Example 1, and one of the spring fingers passes through an opening in a first of the ground planes to contact a second of the ground planes.

Example 3 may include the subject matter of Examples 1 and 2, and the ground clip includes beryllium copper (BeCu).

Example 4 may include the subject matter of Examples 1-3, and the ground clip is plated with gold (Au).

Example 5 may include the subject matter of Examples 1-4, and one of the ground planes is associated with a display element of the device and grounding is provided to reduce electro-static discharge.

Example 6 may include the subject matter of Examples 1-5, and the display element is an organic light emitting diode (OLED) display element.

Example 7 may include the subject matter of Examples 1-6, and one of the ground planes is associated with a metal structure configured to provide rigidity for the device.

Example 8 may include the subject matter of Examples 1-7, and the spring fingers are configured to adapt to manufacturing tolerance variations in relative positions of the ground planes.

According to Example 9 there is provided a method for coupling ground planes of a device. The method may include: bonding a ground clip to the device, and the ground clip is electrically conductive and includes a plurality of spring fingers; configuring a first of the spring fingers to contact a first of the ground planes; configuring a second of the spring fingers to contact a second of the ground planes; creating an opening in the second ground plane; and configuring a third of the spring fingers to contact a third of the ground planes through the opening in the second ground plane.

Example 10 may include the subject matter of Example 9, and the bonding further includes press fitting the ground clip to a structural member of the device.

Example 11 may include the subject matter of Examples 9 and 10, further including opening a hole in a portion of the ground clip to receive a plastic stud to secure the ground clip to a structural member of the device using thermoplastic staking.

Example 12 may include the subject matter of Examples 9-11, and the ground clip includes beryllium copper (BeCu) and is plated with gold (Au).

Example 13 may include the subject matter of Examples 9-12, and one of the ground planes is associated with a display element of the device and grounding is provided to reduce electro-static discharge.

Example 14 may include the subject matter of Examples 9-13, and the display element is an organic light emitting diode (OLED) display element.

Example 15 may include the subject matter of Examples 9-14, and one of the ground planes is associated with a metal structure configured to provide rigidity for the device.

Example 16 may include the subject matter of Examples 9-15, and the spring fingers are configured to adapt to manufacturing tolerance variations in relative positions of the ground planes.

According to Example 17 there is provided a device. The device may include: a plurality of ground planes; and an electrically conductive ground clip. The ground clip may include: a base portion to secure the ground clip to the device; and a plurality of spring fingers, each of the spring fingers to contact and electrically couple to one of the plurality of ground planes, and the ground clip is to provide a conduction path between each of the spring fingers.

Example 18 may include the subject matter of Example 17, and the device is one of a smart phone, a smart tablet, a personal digital assistant (PDA), a mobile Internet device (MID), a convertible tablet, a notebook or a laptop computer.

Example 19 may include the subject matter of Examples 17 and 18, and one of the spring fingers passes through an opening in a first of the ground planes to contact a second of the ground planes.

Example 20 may include the subject matter of Examples 17-19, and the ground clip includes beryllium copper (BeCu).

Example 21 may include the subject matter of Examples 17-20, and the ground clip is plated with gold (Au).

Example 22 may include the subject matter of Examples 17-21, further including a display element, and one of the ground planes is associated with the display element and grounding is provided to reduce electro-static discharge.

Example 23 may include the subject matter of Examples 17-22, and the display element is an organic light emitting diode (OLED) display element.

Example 24 may include the subject matter of Examples 17-23, further including a metal structure configured to provide rigidity for the device, and one of the ground planes is associated with the metal structure.

Example 25 may include the subject matter of Examples 17-24, and the spring fingers are configured to adapt to manufacturing tolerance variations in relative positions of the plurality of ground planes.

According to Example 26 there is provided a system for coupling ground planes of a device. The system may include: means for bonding a ground clip to the device, and the ground clip is electrically conductive and includes a plurality of spring fingers; means for configuring a first of the spring fingers to contact a first of the ground planes; means for configuring a second of the spring fingers to contact a second of the ground planes; means for creating an opening in the second ground plane; and means for configuring a third of the spring fingers to contact a third of the ground planes through the opening in the second ground plane.

Example 27 may include the subject matter of Example 26, and the means for bonding further includes means for press fitting the ground clip to a structural member of the device.

Example 28 may include the subject matter of Examples 26 and 27, further including means for opening a hole in a portion of the ground clip to receive a plastic stud to secure the ground clip to a structural member of the device using thermoplastic staking.

Example 29 may include the subject matter of Examples 26-28, and the ground clip includes beryllium copper (BeCu) and is plated with gold (Au).

Example 30 may include the subject matter of Examples 26-29, and one of the ground planes is associated with a display element of the device and grounding is provided to reduce electro-static discharge.

Example 31 may include the subject matter of Examples 26-30, and the display element is an organic light emitting diode (OLED) display element.

Example 32 may include the subject matter of Examples 26-31, and one of the ground planes is associated with a metal structure configured to provide rigidity for the device.

Example 33 may include the subject matter of Examples 26-32, and the spring fingers are configured to adapt to manufacturing tolerance variations in relative positions of the ground planes.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A ground clip for coupling a plurality of ground planes of a device, said ground clip comprising:
    a base portion to secure said ground clip to said device, said base portion defining a longitudinal axis; and
    at least a first, second and third spring finger extending from said base portion, said first and second spring fingers having a proximal end adjacent said base portion and a distal end, each of said first and second spring fingers extending from opposite ends of said base portion in a direction away from each other continuously along said longitudinal axis from said proximal end to said distal end; and
    wherein each of said first, second and third spring fingers are configured to contact and electrically couple to one of said ground planes, and wherein said ground clip is electrically conductive to provide a conduction path between each of said spring fingers.

2. The ground clip of claim 1, wherein said third spring finger extends substantially transverse relative to said first and second spring fingers.

3. The ground clip of claim 1, wherein said ground clip comprises beryllium copper (BeCu).

4. The ground clip of claim 1, wherein said ground clip is plated with gold (Au).

5. The ground clip of claim 1, wherein one of said ground planes is associated with a display element of said device and grounding is provided to reduce electro-static discharge.

6. The ground clip of claim 5, wherein said display element is an organic light emitting diode (OLED) display element.

7. The ground clip of claim 1, further comprising a fourth spring finger extending from said base portion in a direction opposite from that of said third spring finger.

8. The ground clip of claim 1, wherein said base portion includes a hole to secure said ground clip to said device and wherein each spring finger of said plurality of spring fingers extend in a direction away from said hole.

9. A method for coupling ground planes of a device, said method comprising:
    bonding a ground clip to said device, wherein said ground clip is electrically conductive and comprises a plurality of spring fingers;
    configuring a first of said spring fingers to contact a first of said ground planes;
    configuring a second of said spring fingers to contact a second of said ground planes;
    creating an opening in said second ground plane; and
    configuring a third of said spring fingers to contact a third of said ground planes through said opening in said second ground plane.

10. The method of claim 9, wherein said bonding further comprises press fitting said ground clip to a structural member of said device.

11. The method of claim 9, further comprising opening a hole in a portion of said ground clip to receive a plastic stud to secure said ground clip to a structural member of said device using thermoplastic staking.

12. The method of claim 9, wherein said ground clip comprises beryllium copper (BeCu) and is plated with gold (Au).

13. The method of claim 9, wherein one of said ground planes is associated with a display element of said device and grounding is provided to reduce electro-static discharge.

14. The method of claim 13, wherein said display element is an organic light emitting diode (OLED) display element.

15. The method of claim 9, wherein one of said ground planes is associated with a metal structure configured to provide rigidity for said device.

16. The method of claim 9, wherein said spring fingers are configured to adapt to manufacturing tolerance variations in relative positions of said ground planes.

17. A device comprising:
    a plurality of ground planes; and
    an electrically conductive ground clip comprising:
        a base portion to secure said ground clip to said device, said base portion defining a longitudinal axis; and at least a first, second and third spring finger extending from said base portion, said first and second spring fingers having a proximal end adjacent said base portion and a distal end, each of said first and second spring fingers extending from opposite ends of said base portion in a direction away from each other continuously along said longitudinal axis from said proximal end to said distal end; and wherein each of said first, second and third spring fingers are configured to contact and electrically couple to one of said plurality of ground planes, and wherein said ground clip is to provide a conduction path between each of said spring fingers.

18. The device of claim 17, wherein said device is one of a smart phone, a smart tablet, a personal digital assistant (PDA), a mobile Internet device (MID), a convertible tablet, a notebook or a laptop computer.

19. The device of claim 17, wherein one of said spring fingers passes through an opening in a first of said ground planes to contact a second of said ground planes.

20. The device of claim 17, wherein said ground clip comprises beryllium copper (BeCu).

21. The device of claim 17, wherein said ground clip is plated with gold (Au).

22. The device of claim 17, further comprising a display element, wherein one of said ground planes is associated with said display element and grounding is provided to reduce electro-static discharge.

23. The device of claim 22, wherein said display element is an organic light emitting diode (OLED) display element.

24. The device of claim 17, further comprising a metal structure configured to provide rigidity for said device, wherein one of said ground planes is associated with said metal structure.

25. The device of claim 17, wherein said spring fingers are configured to adapt to manufacturing tolerance variations in relative positions of said plurality of ground planes.

\* \* \* \* \*